(12) United States Patent
Holmes et al.

(10) Patent No.: US 6,732,319 B2
(45) Date of Patent: May 4, 2004

(54) METHOD AND APPARATUS FOR PROTECTING APPLIANCE MEMORY CONTENTS

(75) Inventors: John Steven Holmes, Sellersburg, IN (US); Robert Marten Bultman, Prospect, KY (US)

(73) Assignee: General Electric Company, Schenectady, NY (US)

( * ) Notice: Subject to any disclaimer, the term of this patent is extended or adjusted under 35 U.S.C. 154(b) by 98 days.

(21) Appl. No.: 09/754,596

(22) Filed: Jan. 5, 2001

(65) Prior Publication Data

US 2002/0126544 A1 Sep. 12, 2002

(51) Int. Cl.⁷ .......................... G11C 29/00; H03M 13/00
(52) U.S. Cl. .......................... 714/764; 714/773; 714/776
(58) Field of Search .................. 714/763, 764, 714/773, 776

(56) References Cited

U.S. PATENT DOCUMENTS

| | | | |
|---|---|---|---|
| 4,647,223 A | 3/1987 | Fiddler | |
| 5,398,251 A | 3/1995 | Shim | |
| 5,454,230 A | 10/1995 | Janke et al. | |
| 5,574,857 A | * 11/1996 | Ramakrishnan et al. | 714/54 |
| 6,131,400 A | * 10/2000 | Seok et al. | 62/154 |

* cited by examiner

Primary Examiner—Albert Decady
Assistant Examiner—Joseph D. Torres
(74) Attorney, Agent, or Firm—H. Neil Houser, Esq.; Armstrong Teasdale LLP

(57) ABSTRACT

In an exemplary embodiment, an appliance control system includes a controller having a processor and a memory including at least a first memory area and a second memory area so that a multiple write architecture may be used for storing data. The processor is configured to acquire appliance status data on a periodic basis, write the refrigerator status data to the first memory area and to the second memory area, and perform error detection upon the written data during refrigerator power-up. Upon power up, the controller determines the validity of data in one of the memory locations, or pages. If the data is determined to be invalid on one memory page, another memory page is used. Thus, by storing data redundantly in multiple memory pages with appropriate security measures, data may be retained for use on power-up without the expense of additional electronic components.

27 Claims, 6 Drawing Sheets

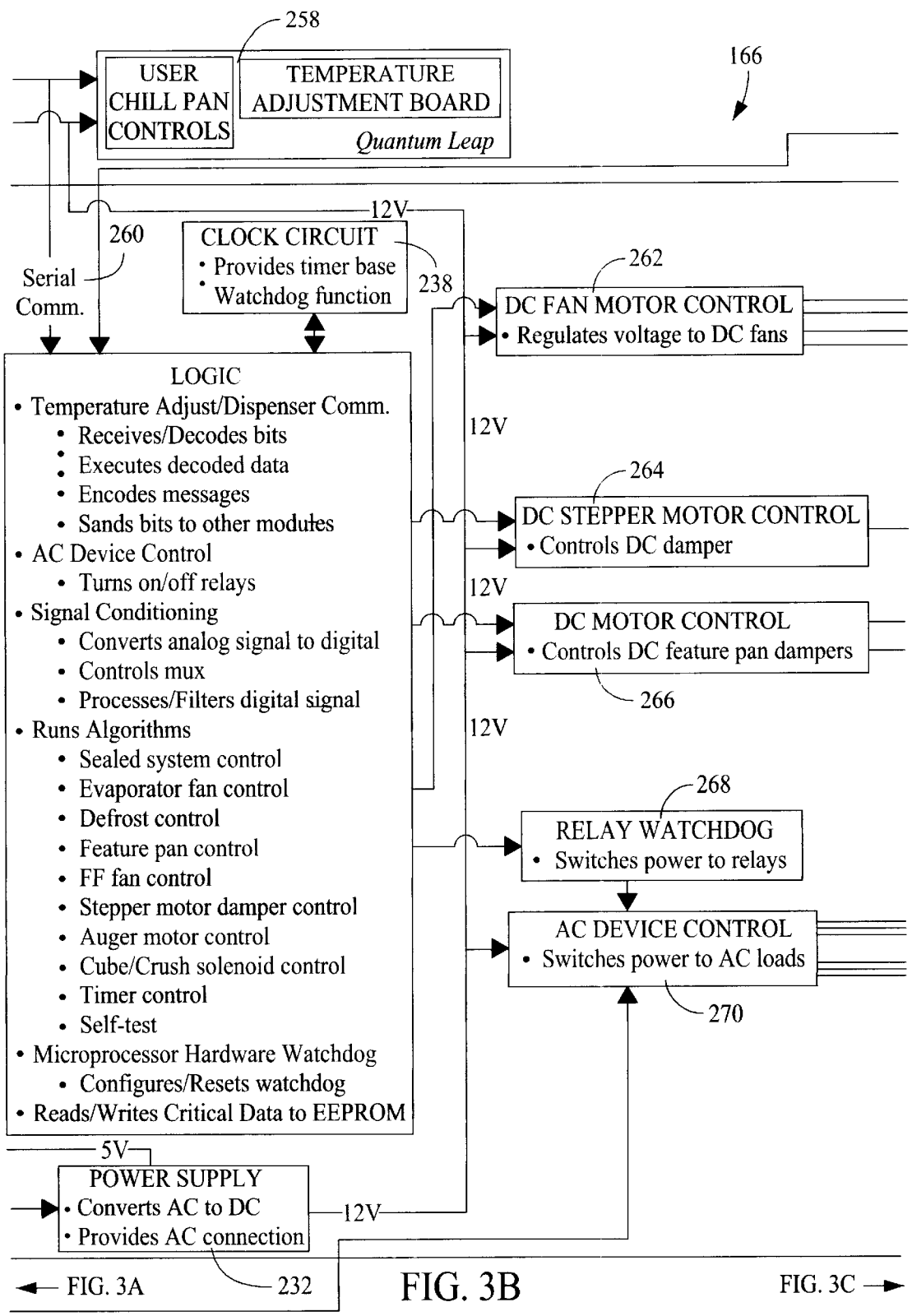

METHOD AND APPARATUS FOR PROTECTING APPLIANCE MEMORY CONTENTS

BACKGROUND OF THE INVENTION

This invention relates generally to control systems for appliances, and more particularly, to a control system for a refrigerator.

Known household appliances are available in various platforms having different structural features, operational features, and controls. For example, known refrigerator platforms include side-by-side single and double fresh food and freezer compartments, and vertically oriented fresh food and freezer compartments including top mounted freezer compartments, and bottom mounted freezer compartments. Conventionally, a different control system is used in each refrigerator platform. For example, a control system for a side-by-side refrigerator typically controls the freezer temperature by controlling operation of a mullion damper located between the fresh food compartment and the freezer compartment, a fresh food fan and a variable or multi-speed fan-speed evaporator fan. Top mount refrigerators and bottom mount refrigerators however, are available with and without a mullion damper, the absence or presence of which consequently affects the refrigerator controls. Other major appliances, including dishwashers, washing machines, dryers and ranges, are available in various platforms and employ different control schemes.

In case of power failure, at least some electronically controlled appliances typically include additional electronic components, such as a power failure detection circuit and a capacitive tank, that allow the system time to write data to system memory as the power is failing. By saving pertinent data, the appliance may recover more efficiently and without unnecessarily resetting itself when power is restored, especially when power outages are relatively brief. Thus, for example, a refrigerator cooling cycle or defrost cycle may be resumed from the point of power loss when power loss is brief and without significant effect on refrigerator conditions. Additional electronic components for writing data in a power loss, however, increase costs of the appliance.

BRIEF SUMMARY OF THE INVENTION

In an exemplary embodiment, an appliance control system includes a controller having a processor and a memory including at least a first memory area and a second memory area so that a multiple write architecture may be used for storing data. The processor is configured to acquire appliance status data on a periodic basis, write the refrigerator status data to the first memory area and to the second memory area, and perform error detection upon the written data during refrigerator power-up. Upon power up, the controller determines the validity of data in one of the memory locations, or pages. If the data is determined to be invalid on one memory page, another memory page is used. Thus, by storing data redundantly in multiple memory pages with appropriate security measures, data may be retained for use on power-up without the expense of additional electronic components.

More specifically, for a refrigerator control system, the appliance status data includes at least one of a defrost time, last compression cycle time, and a water filter remainder time. The memory includes at least four memory areas, and about every thirty minutes, the processor writes status data to first and second memory locations, as well as calculates a Cyclic Redundancy Check value for the acquired data and stores the Cyclic Redundancy Check value in the third and fourth memory locations. Upon power-up, the processor re-calculates a Cyclic Redundancy Check value for the acquired refrigerator status data stored in the first memory location. The calculated Cyclic Redundancy Check value is compared to a stored Cyclic Redundancy Check value in the third memory location. If the calculated Cyclic Redundancy Check matches the stored Cyclic Redundancy Check, the data contained in the first memory location is restored and the controller resumes appliance operation.

If the calculated Cyclic Redundancy Check does not match the stored Cyclic Redundancy Check from the third memory location, the processor re-calculates a Cyclic Redundancy Check for the acquired refrigerator status data stored in the second memory location. The calculated Cyclic Redundancy Check is then compared to a stored Cyclic Redundancy Check value in the fourth memory location. If the calculated Cyclic Redundancy Check matches the stored Cyclic Redundancy Check, the data contained in the second memory location is restored and the controller resumes appliance operation.

If the calculated Cyclic Redundancy Check from data stored in the second memory location does not match the stored Cyclic Redundancy Check from the fourth memory location, the status data is reset to default values and the controller resumes appliance operation.

Thus, redundant data storage with error detection provides low cost data protection without additional electronic components with minimal risk of corrupted data in all of the memory locations.

BRIEF DESCRIPTION OF THE DRAWINGS

FIGS. 3A, 3B, and 3C are a block diagram of the main control board shown in FIG. 2.

DETAILED DESCRIPTION OF THE INVENTION

Figure 1:
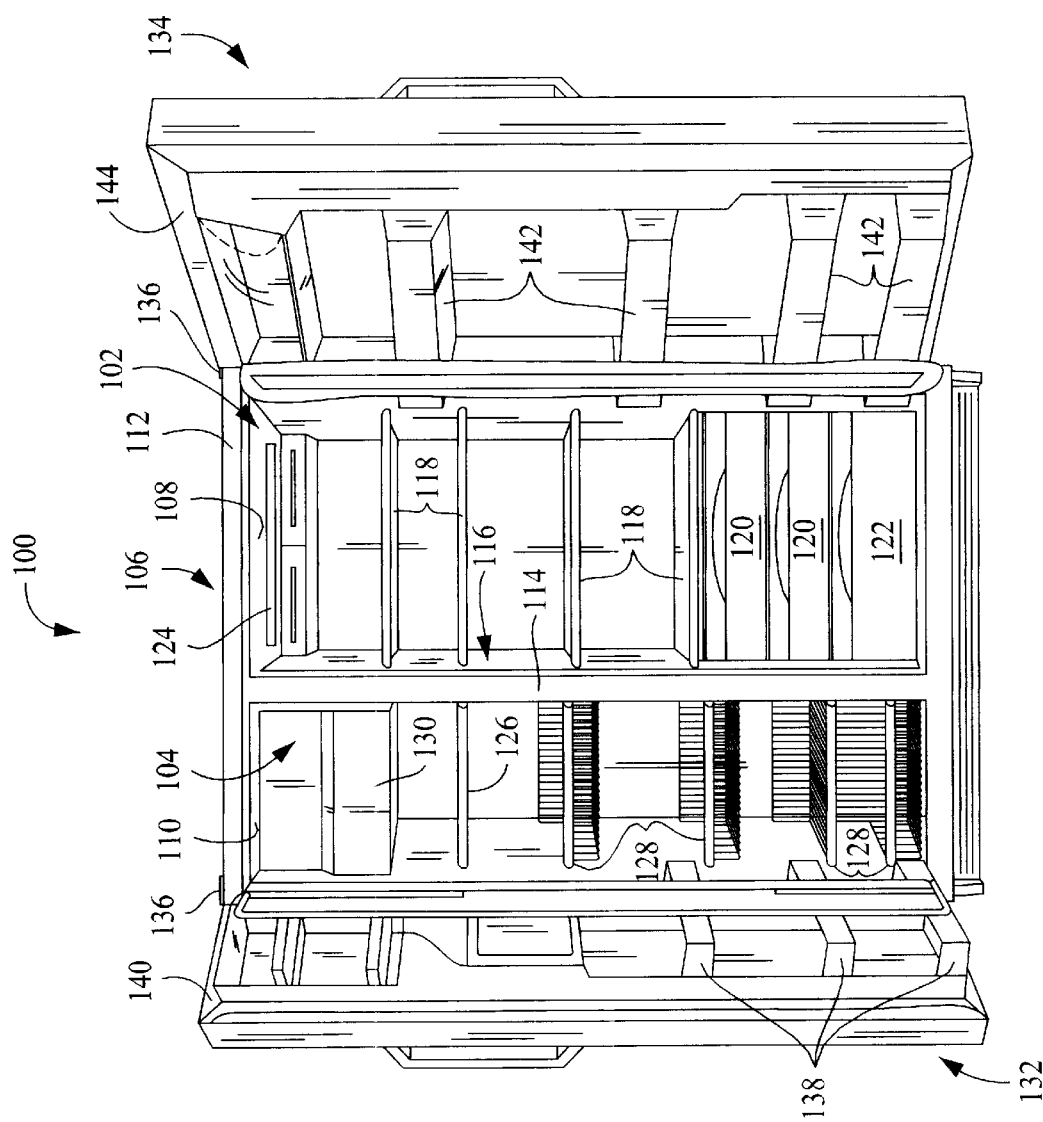
FIG. 1 is a perspective view of a refrigerator.

FIG. 1 illustrates a side-by-side refrigerator 100 in which the present invention may be practiced. It is recognized, however, that the benefits of the present invention apply to other types of electronically controlled appliances, such as dishwashers, washing machines, and ranges. Consequently, the description set forth herein is for illustrative purposes only and is not intended to limit the invention to practice with a particular appliance, such as refrigerator 100.

Refrigerator 100 includes a fresh food storage compartment 102 and a freezer storage compartment 104. Freezer compartment 104 and fresh food compartment 102 are arranged side-by-side. A side-by-side refrigerator such as refrigerator 100 is commercially available from General Electric Company, Appliance Park, Louisville, Ky. 40225.

Refrigerator 100 includes an outer case 106 and inner liners 108 and 110. A space between case 106 and liners 108 and 110, and between liners 108 and 110, is filled with foamed-in-place insulation. Outer case 106 normally is formed by folding a sheet of a suitable material, such as pre-painted steel, into an inverted U-shape to form top and side walls of case. A bottom wall of case 106 normally is formed separately and attached to the case side walls and to a bottom frame that provides support for refrigerator 100. Inner liners 108 and 110 are molded from a suitable plastic material to form freezer compartment 104 and fresh food compartment 102, respectively. Alternatively, liners 108, 110 may be formed by bending and welding a sheet of a suitable metal, such as steel. The illustrative embodiment includes two separate liners 108, 110 as it is a relatively large capacity unit and separate liners add strength and are easier to maintain within manufacturing tolerances. In smaller refrigerators, a single liner is formed and a mullion spans between opposite sides of the liner to divide it into a freezer compartment and a fresh food compartment.

A breaker strip 112 extends between a case front flange and outer front edges of liners. Breaker strip 112 is formed from a suitable resilient material, such as an extruded acrylo-butadiene-styrene based material (commonly referred to as ABS).

The insulation in the space between liners 108, 110 is covered by another strip of suitable resilient material, which also commonly is referred to as a mullion 114. Mullion 114 also preferably is formed of an extruded ABS material. It will be understood that in a refrigerator with separate mullion dividing a unitary liner into a freezer and a fresh food compartment, a front face member of mullion corresponds to mullion 114. Breaker strip 112 and mullion 114 form a front face, and extend completely around inner peripheral edges of case 106 and vertically between liners 108, 110. Mullion 114, insulation between compartments, and a spaced wall of liners separating compartments, sometimes are collectively referred to herein as a center mullion wall 116.

Shelves 118 and slide-out drawers 120 normally are provided in fresh food compartment 102 to support items being stored therein. A bottom drawer or pan 122 partly forms a quick chill and thaw system (not shown) and selectively controlled, together with other refrigerator features, by a microprocessor (not shown in FIG. 1) according to user preference via manipulation of a control interface 124 mounted in an upper region of fresh food storage compartment 102 and coupled to the microprocessor. A shelf 126 and wire baskets 128 are also provided in freezer compartment 104. In addition, an ice maker 130 may be provided in freezer compartment 104.

A freezer door 132 and a fresh food door 134 close access openings to fresh food and freezer compartments 102, 104, respectively. Each door 132, 134 is mounted by a top hinge 136 and a bottom hinge (not shown) to rotate about its outer vertical edge between an open position, as shown in FIG. 1, and a closed position (not shown) closing the associated storage compartment. Freezer door 132 includes a plurality of storage shelves 138 and a sealing gasket 140, and fresh food door 134 also includes a plurality of storage shelves 142 and a sealing gasket 144.

In accordance with known refrigerators, refrigerator 100 also includes a machinery compartment (not shown) that at least partially contains components for executing a known vapor compression cycle for cooling air. The components include a compressor (not shown in FIG. 1), a condenser (not shown in FIG. 1), an expansion device (not shown in FIG. 1), and an evaporator (not shown in FIG. 1) connected in series and charged with a refrigerant. The evaporator is a type of heat exchanger which transfers heat from air passing over the evaporator to a refrigerant flowing through the evaporator, thereby causing the refrigerant to vaporize. The cooled air is used to refrigerate one or more refrigerator or freezer compartments via fans (not shown in FIG. 1).

Collectively, the vapor compression cycle components in a refrigeration circuit, associated fans, and associated compartments are referred to herein as a sealed system. The construction of the sealed system is well known and therefore not described in detail herein, and the sealed system is operable to force cold air through the refrigerator in response to sensed conditions via a plurality of sensors (not shown in FIG. 1).

Figure 2:
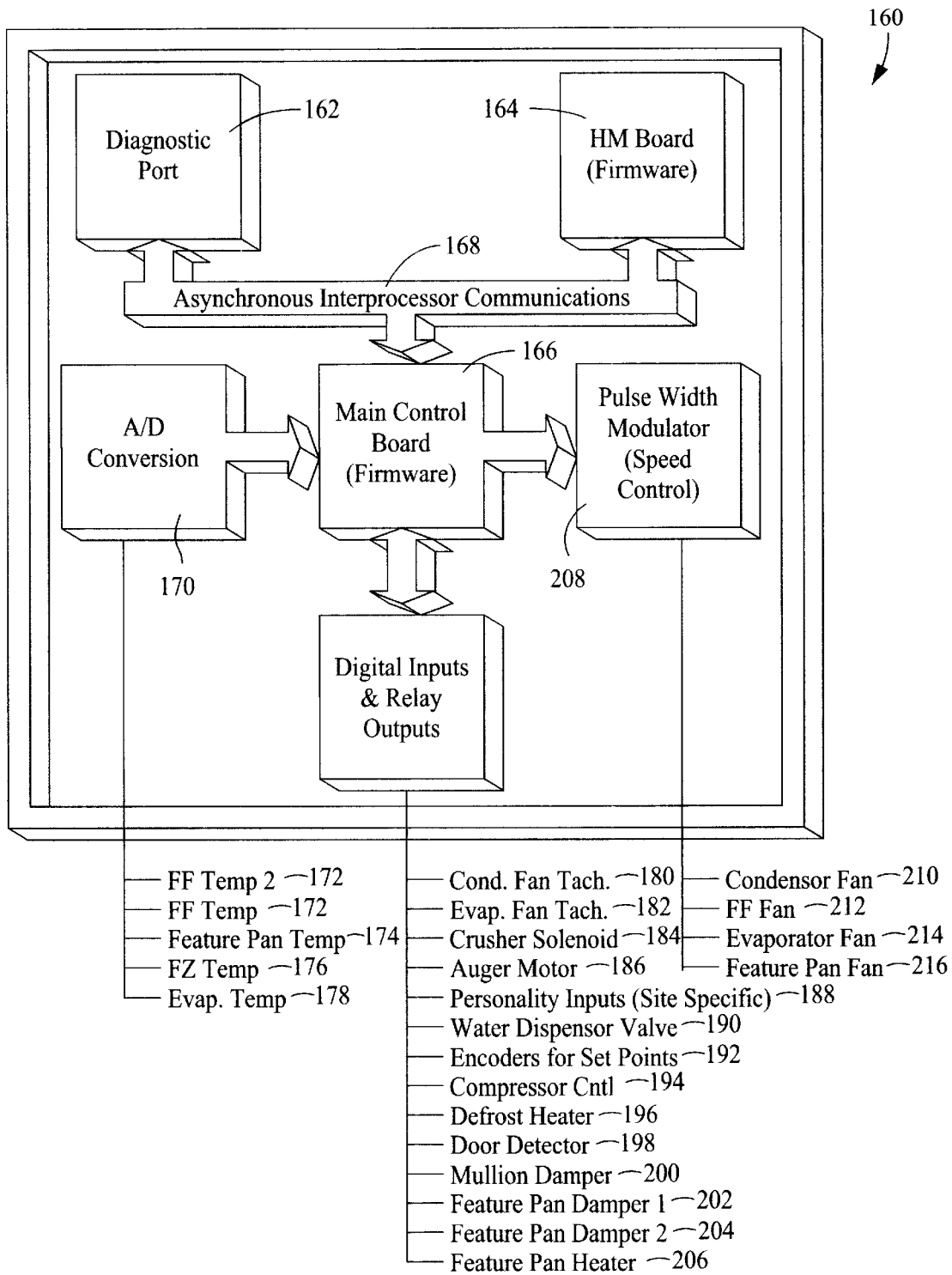
FIG. 2 is a block diagram of a refrigerator controller in accordance with one embodiment of the present invention.
Figure 3A:
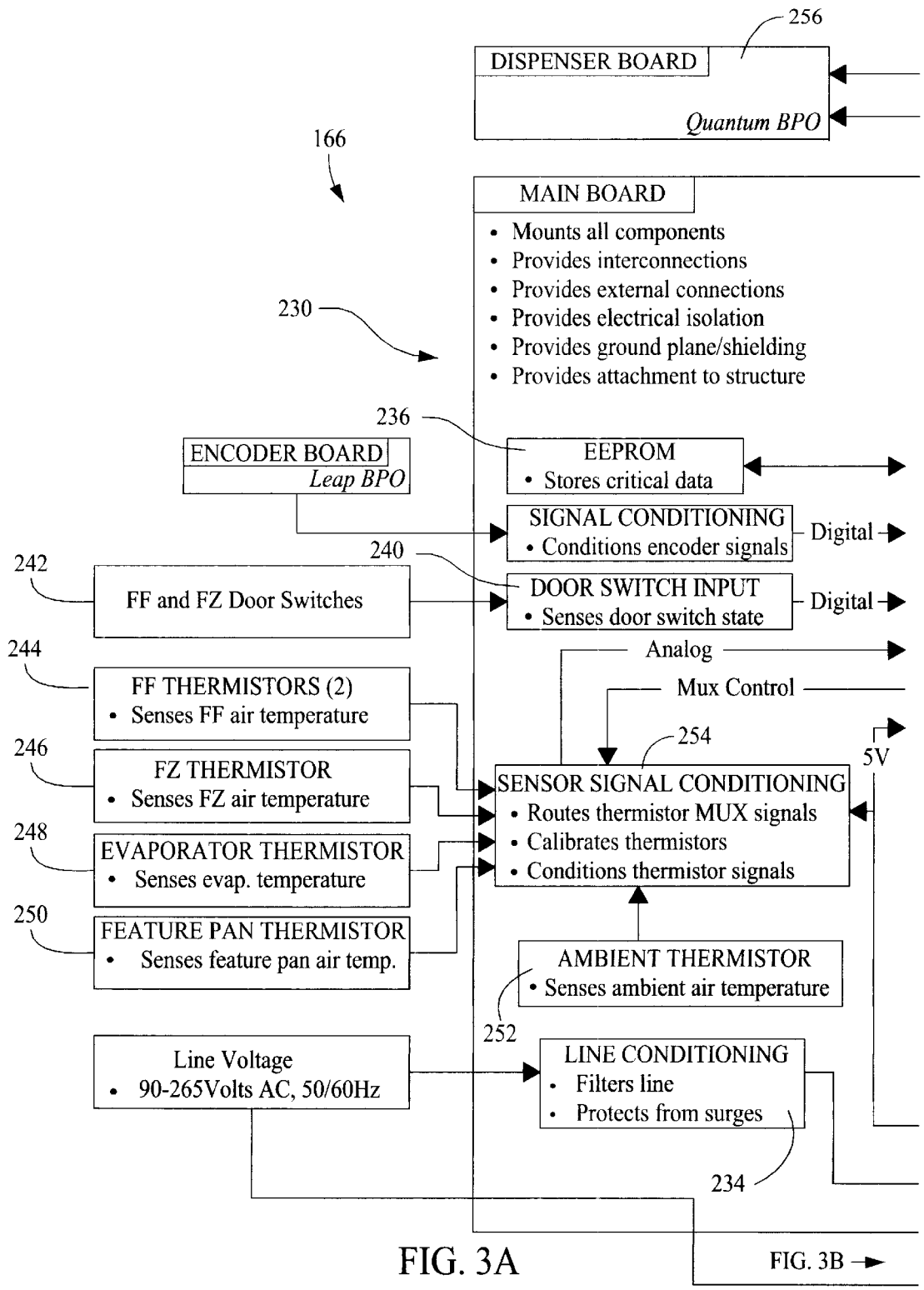
Figure 3C:
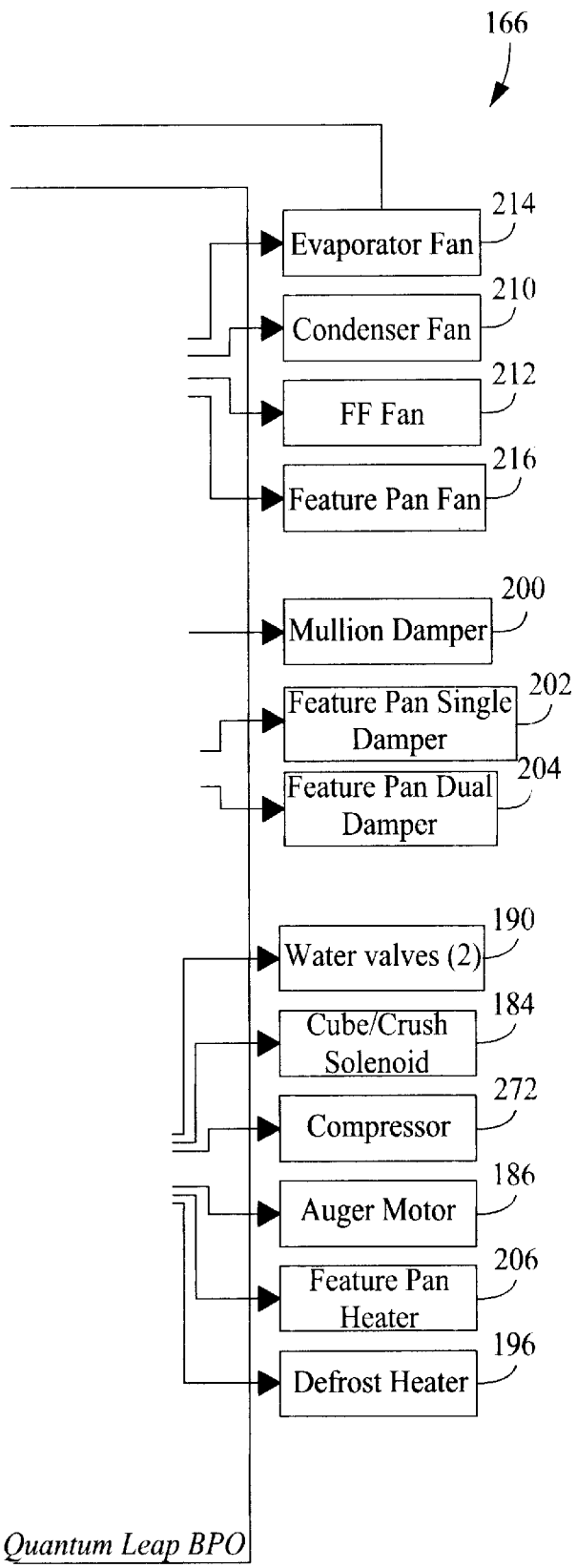
Figure 4:
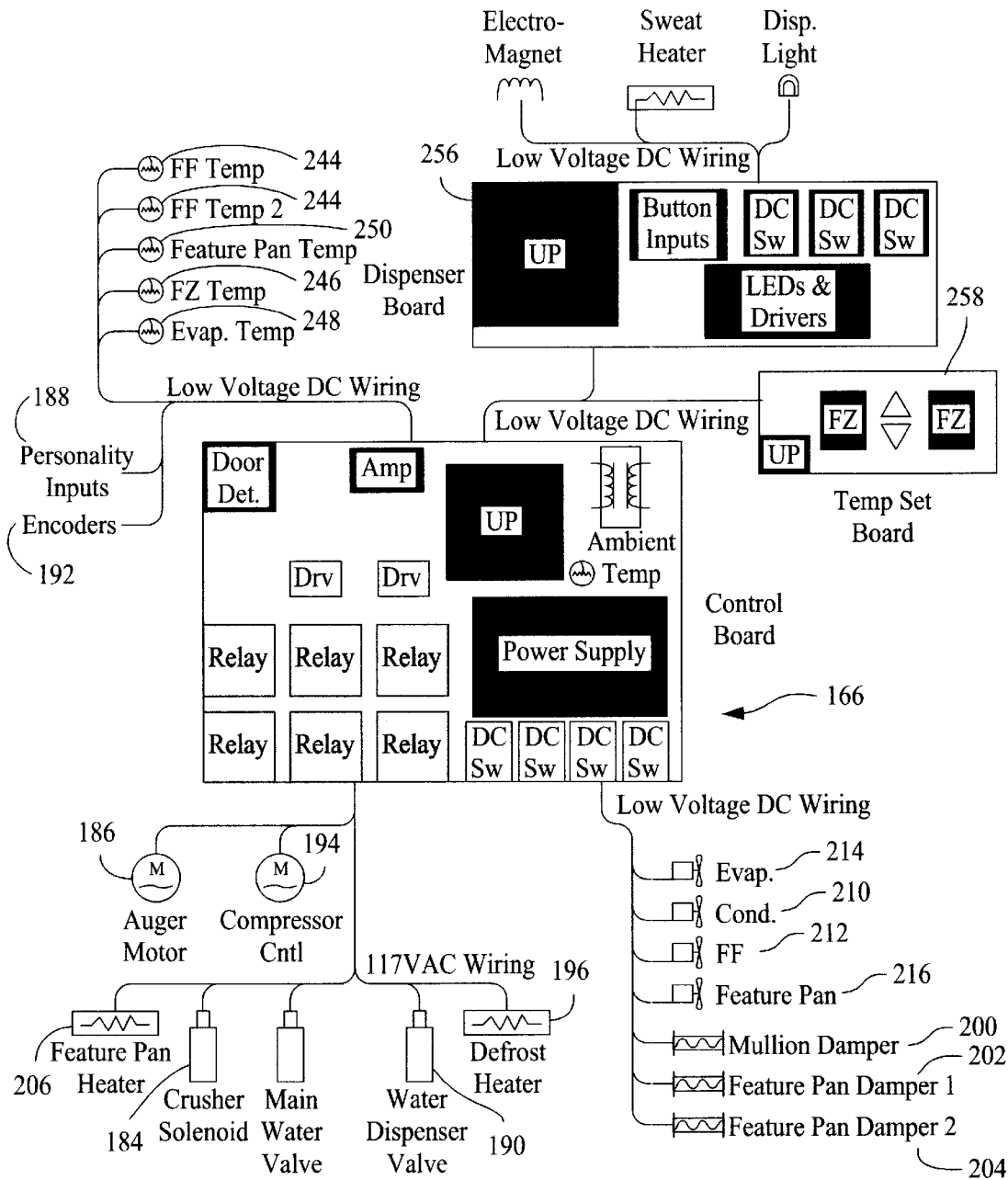
FIG. 4 is a block diagram of the main control board shown in FIG. 2.

FIG. 2 illustrates an exemplary controller 160 in accordance with one embodiment of the present invention. Controller 160 can be used, for example, in refrigerators, freezers and combinations thereof, including but not limited to refrigerator 100 (shown in FIG. 1). It is recognized, however, that controller 160 is easily adaptable to control other types of appliances, including but not limited to dishwashers, washing machines, dryers and ranges in light of the principles set forth below.

Controller 160 includes a diagnostic port 162 and a human machine interface (HMI) board 164 coupled to a main control board 166 by an asynchronous interprocessor communications bus 168. An analog to digital converter ("A/D converter") 170 is coupled to main control board 166. A/D converter 170 converts analog signals from a plurality of sensors including one or more fresh food compartment temperature sensors 172, a quick chill/thaw feature pan (i.e., pan 122 sown in FIG. 1) temperature sensors 174 (shown in FIG. 8), freezer temperature sensors 176, external temperature sensors (not shown in FIG. 2), and evaporator temperature sensors 178 into digital signals for processing by main control board 166.

In an alternative embodiment (not shown), A/D converter 170 digitizes other input functions (not shown), such as a power supply current and voltage, brownout detection, compressor cycle adjustment, analog time and delay inputs (both use based and sensor based) where the analog input is coupled to an auxiliary device (e.g., clock or finger pressure activated switch), analog pressure sensing of the compressor sealed system for diagnostics and power/energy optimization. Further input functions include external communication via IR detectors or sound detectors, HMI display dimming based on ambient light, adjustment of the refrigerator to react to food loading and changing the air flow/ pressure accordingly to ensure food load cooling or heating as desired, and altitude adjustment to ensure even food load cooling and enhance pull-down rate of various altitudes by changing fan speed and varying air flow.

Digital input and relay outputs correspond to, but are not limited to, a condenser fan speed 180, an evaporator fan speed 182, a crusher solenoid 184, an auger motor 186, personality inputs 188, a water dispenser valve 190, encoders 192 for set points, a compressor control 194, a defrost heater 196, a door detector 198, a mullion damper 200, feature pan air handler dampers 202, 204, and a quick chill/thaw feature pan heater 206. Main control board 166 also is coupled to a pulse width modulator 208 for controlling the operating speed of a condenser fan 210, a fresh food compartment fan 212, an evaporator fan 214, and a quick chill system feature pan fan 216.

FIGS. 3A, 3B, 3C, and 4 are more detailed block diagrams of main control board 166. As shown in FIGS. 3A, 3B, 3C, and 4, main control board 166 includes a processor 230. Processor 230 performs temperature adjustments/dispenser communication, AC device control, signal conditioning, microprocessor hardware watchdog, and EEPROM read/ write functions. In addition, processor executes many control algorithms including sealed system control, evaporator fan control, defrost control, feature pan control, fresh food fan control, stepper motor damper control, water valve control, auger motor control, cube/crush solenoid control, timer control, and self-test operations.

Processor 230 is coupled to a power supply 232 which receives an AC power signal from a line conditioning unit 234. Line conditioning unit 234 filters a line voltage which is, for example, a 90–265 Volts AC, 50/60 Hz signal. Processor 230 also is coupled to an EEPROM 236 and a clock circuit 238.

A door switch input sensor 240 is coupled to fresh food and freezer door switches 242, and senses a door switch state. A signal is supplied from door switch input sensor 240 to processor 230, in digital form, indicative of the door switch state. Fresh food thermistors 244, a freezer thermistor 246, at least one evaporator thermistor 248, a feature pan thermistor 250, and an ambient thermistor 252 are coupled to processor 230 via a sensor signal conditioner 254. Conditioner 254 receives a multiplex control signal from processor 230 and provides analog signals to processor 230 representative of the respective sensed temperatures. Processor 230 also is coupled to a dispenser board 256 and a temperature adjustment board 258 via a serial communications link 260. Conditioner 254 also calibrates the above-described thermistors 244, 246, 248, 250, and 252.

Processor 230 provides control outputs to a DC fan motor control 262, a DC stepper motor control 264, a DC motor control 266, and a relay watchdog 268. Watchdog 268 is coupled to an AC device controller 270 that provides power to AC loads, such as to water valve 190, cube/crush solenoid 184, a compressor 272, auger motor 186, a feature pan heater 206, and defrost heater 196. DC fan motor control 266 is coupled to evaporator fan 214, condenser fan 210, fresh food fan 212, and feature pan fan 216. DC stepper motor control 266 is coupled to mullion damper 200, and DC motor control 266 is coupled to one of more sealed system dampers. The foregoing functions of the above-described electronic control system are performed under the control of firmware implemented as small independent state machines.

Unlike conventional control systems that employ additional electronic components, such as power detection circuits and capacitive tanks, to write and retain data stored in controller memory through power interruptions, failures, or losses, controller 160 employs multiple pages of memory for data storage. Periodically, pertinent data is written to the pages, with each page containing its own data security bytes. Upon power up, controller 160 determines the validity of data in one of the pages. If the data is determined to be invalid on one memory page, another memory page is used. Thus, by storing data redundantly in multiple memory pages with appropriate security measures, data may be retained for use on power-up without the expense of additional electronic components.

For example, in one embodiment, stored and retained data for refrigerator 100 (shown in FIG. 1) includes refrigerator operating parameters such as a defrost cycle time, a last compressor cycle time, and a water filter reminder timer. Specifically, the data values corresponding to these operating parameters are written periodically at a predetermined interval, such about every thirty minutes, and stored in system memory 236. If power is interrupted, stored data values in memory 236 or other non-volatile memory will be up to thirty minutes old when power is lost, which has been found sufficient for refrigeration system performance upon recovery when power is restored. When power interruption is prolonged, the stored data may become stale, but as long as the stored values are retained during power loss, the system may recover without unnecessarily resetting cooling cycles, defrost cycles, and a water filter timer.

In alternative, embodiments, update intervals of greater or lesser than thirty minutes are used for writing selected control data to system memory.

Controller 160 employs a multiple write architecture to securely retain stored date values for use upon power-up of refrigerator 100. As explained further below, an exemplary multiple-write architecture is set forth in the following memory map for a controller configured with five pages, or areas, of memory for writing data.

| Memory Area | Purpose |
| --- | --- |
| 1 | Daily Memory Updates |
| 2 | CRC For Data Security of Daily Memory Updates |
| 3 | Factory Programmed Memory Area |
| 4 | Copy of Daily Memory Updates |
| 5 | CRC For Data Security of Copy of Daily Memory Updates |

In operation, controller 160 sets a timer, such as timer 238 (shown in FIGS. 3A, 3B, and 3C) for reading and writing selected data to memory at the expiration of a predetermined period such as thirty minutes. When timer 238 expires, controller 160 executes the following functions with respect to the above memory map. A Cyclic Redundancy Check (CRC) is calculated for selected data to be written. The selected data is written to area "1" of the memory, and the calculated CRC is written to area "2" of the memory. The selected data, however, is also written to area "4" of the memory; and the calculated CRC is also written to area "5" of the memory. Thus, area "4" and "5" contain "copies" of the data stored in memory areas "1" and "2."

When power is supplied to refrigerator 100 and controller powers-up, main control board 166 (shown in FIGS. 3A, 3B, 3C, and 4) reads area "1" of memory 236 and re-calculates the CRC of the data. Once the CRC is calculated, controller compares the calculated CRC to the CRC data stored in memory area "2." If the calculated CRC equals the stored CRC, the data is valid and controller 160 resumes operation based upon the stored data.

If the calculated CRC is different from the stored CRC, the CRC fails, and it is assumed that power was interrupted while controller 160 was writing data to either memory area "1" or to memory area "2" of memory 236. In the event that the CRC fails with respect to memory areas "1" and "2," controller 166 copies data from area "4" to area "1" and copies data from area "5" to area "2." Once data from areas "4" and "5" are copied. Main control board 166 (shown in FIGS. 3A, 3B, 3C, and 4) again reads area "1" of memory 236 and re-calculates the CRC of the data. Once the CRC is calculated, controller compares the calculated CRC to the CRC data stored in memory area "2." If the calculated CRC equals the stored CRC, the data is valid and controller 160 resumes operation based upon the stored data.

If the calculated CRC is different from the stored CRC, the CRC again fails, and it is assumed that power was also interrupted while controller 160 was writing data to either memory area "4" or to memory area "5" of memory 236. If the CRC again fails, an error is detected and an audio or visual indicator is enabled to alert the user of a fault condition. The system may then be manually or automatically reset after a predetermined time to resume operation of refrigerator 100. In one embodiment, data values are automatically reset to default values and the controller resumes operation of the appliance. Default values may be stored in, for example, area "3" of memory 236.

A likelihood of two power interruptions to affect both memory areas "1 and "2," as well as areas "4" and "5" is small. Therefore, if memory areas "1" and "2" are damaged or corrupted, it is unlikely that areas "4" and "5" will also be damaged, and vice versa.

If the system is writing to memory 236 (shown in FIGS. 3A, 3B, and 3C) at the instant when power is interrupted, the stored data may be scrambled, thereby causing poor behavior of the system when the power is restored. As a safeguard against this condition, a known power failure detection circuit and a capacitive tank may be employed in combination with redundant memory storage to increase a fall time of the power supply and warn microprocessor 230 (shown in FIGS. 3A, 3B, and 3C) of an impending power failure.

In an alternative embodiment, data may be written to greater or fewer memory areas or pages than described above at the same or different time intervals. In addition, alternative comparative mechanisms can be used in lieu of CRC checks to determine validity of stored data, including but not limited to direct comparison of each stored memory value, and review or comparison of other data to confirm or refute an assumed condition by controller 160.

While the invention has been described in terms of various specific embodiments, those skilled in the art will recognize that the invention can be practiced with modification within the spirit and scope of the claims.

What is claimed is:

1. A method to protect memory contents of an appliance, the appliance including a processor and a non-volatile memory, the memory including at least first and second areas, said method comprising the steps of:
   acquiring appliance status data;
   writing the appliance status data to the first non-volatile memory area and the second non-volatile memory area and retaining the data for use during a power-up after a power loss; and
   performing error detection upon the retained data when the appliance powers up by checking the validity of the data written to the non-volatile memory areas before the power loss.

2. A method in accordance with claim 1 wherein the appliance is a refrigerator, said step of acquiring appliance status data comprises the step of acquiring refrigerator operating parameters.

3. A method in accordance with claim 2 wherein said step of acquiring refrigerator operating parameters comprises the step of acquiring at least one of a defrost time, a last compressor cycle time, and a water filter remainder time.

4. A method in accordance with claim 2 wherein said step of writing status data comprises the step of writing status data to a plurality of memory areas at a periodic interval.

5. A method in accordance with claim 4 wherein said step of writing status data comprises the step of writing status data to a plurality of memory areas about every thirty minutes.

6. A method in accordance with claim 5 wherein said step of writing status data comprises the step of determining a Cyclic Redundancy Check value for the acquired refrigerator status data stored in the first memory area.

7. A method in accordance with claim 6, the memory including at least four memory areas, said step of writing status data comprises the step of writing the Cyclic Redundancy Check value for the acquired refrigerator status data in a third memory area and fourth memory area.

8. A method in accordance with claim 1 wherein the memory is an Electrically Erasable Programmable Read Only Memory (EEPROM), said step of writing status data comprises the step of writing status data to the EEPROM.

9. A method in accordance with claim 1 wherein said step of performing error detection comprises the step of calculating a Cyclic Redundancy Check value of the data stored in the first memory area upon power-up of the appliance.

10. A method in accordance with claim 9 wherein said step of performing error detection further comprises the step of comparing the calculated Cyclic Redundancy Check value to a stored Cyclic Redundancy Check value.

11. A method in accordance with claim 10 further comprising the step of copying data from the second memory area to the first memory area when the calculated Cyclic Redundancy Check value does not equal the stored Cyclic Redundancy Check value.

12. An appliance control system comprising:
   a controller comprising a processor and a non-volatile memory, said memory comprising at least a first area and a second area, said processor configured to:
      acquire appliance status data on a periodic basis;
      write the appliance status data to the first memory area and to the second memory area and retain the data for use during a power-up alter a power loss; and
      perform error detection upon the retained data during appliance power-up by checking the validity of the data written to the non-volatile memory areas before the power loss.

13. A system in accordance with claim 12 wherein said memory comprises non-volatile memory.

14. A system in accordance with claim 13 wherein said non-volatile memory comprises an Electrically Erasable Programmable Read Only Memory (EEPROM) configured with a plurality of memory areas, wherein each memory area consists of a page of memory.

15. A system in accordance with claim 14 wherein said memory area is configured to contain a plurality of security bytes.

16. A system in accordance with claim 14 wherein said Electrically Erasable Programmable Read Only Memory (EEPROM) is configured to contain a memory map.

17. A system in accordance with claim 16 wherein said memory map is configured with multiple pages of memory, said memory map comprising at least four areas.

18. A system in accordance with claim 12 wherein the appliance is a refrigerator, said appliance status data including at least one of a defrost time, a last compression cycle time, and a water filter remainder time.

19. A system in accordance with claim 12 wherein the appliance is a refrigerator, said processor further configured to acquire refrigerator operating parameters.

20. A system in accordance with claim 19, said processor further configured to acquire at least one of a defrost time, a last compressor cycle time, and a water filter remainder time.

21. A system in accordance with claim 12, said processor further configured to write status data to a plurality of memory areas about every thirty minutes.

22. A system in accordance with claim 21, said processor further configured to determine a Cyclic Redundancy Check value for the acquired refrigerator status data stored in the first memory area.

23. A system in accordance with claim 22, the memory including at least four memory areas, said processor further configured to write the Cyclic Redundancy Check value for the acquired refrigerator status data in a third memory area and fourth memory area.

24. A system in accordance with claim 12, said processor further configured to calculate a Cyclic Redundancy Check value of the data stored in the first memory area upon power-up of the appliance.

25. A system in accordance with claim 24, said processor further configured to compare the calculated Cyclic Redundancy Check value to a stored Cyclic Redundancy Check value.

26. A system in accordance with claim 25, said processor further configured to copy data from the second memory area to the first memory area when the calculated Cyclic Redundancy Check value does not equal the stored Cyclic Redundancy Check value.

27. A control system for an appliance, said control system comprising:

an electronic controller comprising a memory, said memory comprising at least four areas for writing data; said controller configured to:

periodically acquire appliance status data;

calculate a Cyclic Redundancy Check value on the acquired status data;

store the acquired data in the first and third memory areas;

store the calculated Cyclic Redundancy Check value in the second and fourth memory areas; and upon power-up, said controller further configured to:

calculate a Cyclic Redundancy Check value on the stored data in the first memory area;

compare the calculated Cyclic Redundancy Check value to the stored Cyclic Redundancy Check value in the third memory area; and copy the data from the third memory area to the first memory area when the stored Cyclic Redundancy Check value does not match the calculated Cyclic Redundancy Check value.

\* \* \* \* \*